(12) United States Patent
Lee et al.

(10) Patent No.: US 9,350,277 B2
(45) Date of Patent: May 24, 2016

(54) METHOD OF ESTIMATING VOLTAGE OF INPUT TERMINAL OF INVERTER AND MOTOR CONTROL METHOD USING THE SAME

(71) Applicant: HYUNDAI MOTOR COMPANY, Seoul (KR)

(72) Inventors: Dong Hun Lee, Anyang-si (KR); Sungdo Kim, Seongnam-si (KR); Chang Seok Ryu, Anyang-si (KR)

(73) Assignee: HYUNDAI MOTOR COMPANY, Seoul (KR)

( * ) Notice: Subject to any disclaimer, the term of this patent is extended or adjusted under 35 U.S.C. 154(b) by 97 days.

(21) Appl. No.: 14/522,201

(22) Filed: Oct. 23, 2014

(65) Prior Publication Data

US 2015/0349675 A1    Dec. 3, 2015

(30) Foreign Application Priority Data

Jun. 2, 2014   (KR) ......................... 10-2014-0067187

(51) Int. Cl.
| | | |
|---|---|---|
| *H02P 6/14* | (2016.01) | |
| *G05B 11/01* | (2006.01) | |
| *H02P 6/00* | (2016.01) | |
| *G01R 19/00* | (2006.01) | |
| *G01R 19/25* | (2006.01) | |

(52) U.S. Cl.
CPC ............ *H02P 6/001* (2013.01); *G01R 19/0084* (2013.01); *G01R 19/2503* (2013.01)

(58) Field of Classification Search
CPC .......................... H02M 3/158; H02M 3/33592
USPC ........................................................ 318/400
See application file for complete search history.

(56) References Cited

U.S. PATENT DOCUMENTS

| | | | | |
|---|---|---|---|---|
| 3,569,805 A | * | 3/1971 | Hammond | H02P 23/0095 318/811 |
| 3,577,052 A | * | 5/1971 | Bauer | H02P 23/24 318/798 |
| 4,044,285 A | * | 8/1977 | Plunkett | H02P 21/10 318/803 |
| 4,047,083 A | * | 9/1977 | Plunkett | H02M 7/527 318/807 |
| 4,088,934 A | * | 5/1978 | D'Atre | B60L 11/1803 318/802 |
| 4,088,935 A | * | 5/1978 | D'Atre | H02P 23/08 318/740 |
| 4,227,138 A | * | 10/1980 | Espelage | H02P 27/045 318/801 |
| 4,377,779 A | * | 3/1983 | Plunkett | H02P 27/08 318/802 |
| 4,465,943 A | * | 8/1984 | Risberg | H02J 9/066 307/127 |
| 4,511,834 A | * | 4/1985 | Studtmann | H02M 5/4505 318/700 |
| 4,788,635 A | * | 11/1988 | Heinrich | H02P 3/18 318/762 |
| 7,759,888 B2 | * | 7/2010 | Matsui | H02H 7/0805 318/400.29 |
| 8,583,265 B1 | * | 11/2013 | Schulz | H02P 6/10 318/400.14 |
| 2008/0042613 A1 | * | 2/2008 | Aizawa | H02P 21/34 318/778 |

(Continued)

FOREIGN PATENT DOCUMENTS

| | | |
|---|---|---|
| KR | 10-2008-0068254 A | 7/2008 |
| KR | 10-1140392 B1 | 5/2012 |
| KR | 10-2013-0088444 A | 8/2013 |

*Primary Examiner* — Bentsu Ro
*Assistant Examiner* — Devon Joseph
(74) *Attorney, Agent, or Firm* — McDermott Will & Emery LLP

(57) ABSTRACT

A method for estimating a voltage of an input terminal of an inverter includes checking three-phase currents flowing from an inverter to a motor. A voltage of an input terminal of the inverter is calculated based on a plurality of design parameters, the three-phase currents, and PWM duties for determining switching operations of a plurality of switching elements of the inverter.

27 Claims, 12 Drawing Sheets

(56) References Cited

U.S. PATENT DOCUMENTS

| | | | |
|---|---|---|---|
| 2009/0237013 A1* | 9/2009 | Sato | B60L 15/025 318/400.02 |
| 2012/0250370 A1* | 10/2012 | Taniguchi | H02M 3/33561 363/34 |
| 2013/0330207 A1* | 12/2013 | Nakajima | F04B 17/03 417/44.1 |
| 2014/0028225 A1* | 1/2014 | Takamatsu | H02P 6/08 318/400.3 |
| 2014/0049197 A1* | 2/2014 | Kitanaka | H02P 21/04 318/400.3 |
| 2014/0070743 A1* | 3/2014 | Yoshida | H02P 29/024 318/400.22 |
| 2014/0156144 A1* | 6/2014 | Hoshi | B62D 5/0463 701/41 |
| 2014/0176028 A1* | 6/2014 | Tobari | B60L 15/20 318/400.02 |
| 2014/0354208 A1* | 12/2014 | Kira | H02P 29/0005 318/635 |

* cited by examiner

< RELATED ART >

METHOD OF ESTIMATING VOLTAGE OF INPUT TERMINAL OF INVERTER AND MOTOR CONTROL METHOD USING THE SAME

CROSS-REFERENCE TO RELATED APPLICATION

This application claims the benefit of priority to Korean Patent Application No. 10-2014-0067187 filed in the Korean Intellectual Property Office on Jun. 2, 2014, the entire contents of which are incorporated herein by reference.

TECHNICAL FIELD

The present disclosure relates to a method of estimating a voltage of an input terminal of an inverter and a motor control method using the same.

BACKGROUND

A driving motor of vehicles generates driving power using a battery power. There are various types of motors such as, a motor for driving a water pump, a motor for driving an air blower, etc.

In general, a DC voltage is supplied as a driving voltage to an inverter for driving the motor. A voltage sensor is provided or a voltage sensing circuit is formed on a substrate to measure the DC voltage. When the voltage sensor (or the voltage sensing circuit) becomes defective, the DC voltage cannot be measured, thereby decreasing a motor control performance of the inverter.

FIGS. 9(a) and 9(b) are drawings in which a general sensor and a voltage sensor are compared.

As shown in FIGS. 9(a) and 9(b), when the general sensor (e.g., a pressure sensor) generates an output voltage range of 0 V to 5 V, only the voltage output range of 0.5 V to 4.5 V is used to determine disconnection or a short-circuit of the pressure sensor. That is, if 0 V or 5 V is outputted, the pressure sensor is determined to be disconnected or short-circuited.

However, in the case of the voltage sensor, even if the disconnection or short-circuit of the voltage sensor occur, the overall output voltage range of 0 V to 5 V should be used to sense the voltage, thereby failing to detect such faults.

Due to the disconnection or short-circuit of the voltage sensor, even if the driving voltage is supplied normally to the input terminal of the inverter, it can be determined that no driving voltage is supplied (i.e., output voltage=0 V) or the driving voltage exceeds the supplied voltage (i.e., output voltage=5 V)

That is, even if the driving voltage is supplied normally, output and dynamic characteristics of the motor deteriorate, and an operation of the motor should stop.

The above information disclosed in this Background section is only for enhancement of understanding of the background of the invention, and therefore, it may contain information that does not form the prior art that is already known in this country to a person of ordinary skill in the art.

SUMMARY

The present disclosure has been made in an effort to provide a method of estimating a voltage of an input terminal of an inverter and a method of controlling a motor using the same that are capable of estimating the voltage of the input terminal of the inverter even without a voltage sensor, determining a fault of the voltage sensor when provided with the voltage sensor, and controlling the motor even when the voltage sensor becomes defective.

A method for estimating a voltage of an input terminal of an inverter according to an exemplary embodiment of the present invention includes checking three-phase currents flowing from an inverter to a motor. A voltage of an input terminal of the inverter is calculated based on a plurality of design parameters, the three-phase currents, and PWM duties for determining switching operations of a plurality of switching elements of the inverter.

The step of calculating the voltage of the input terminal of the inverter may include calculating estimated three-phase voltages based on the plurality of design parameters and the three-phase currents. A voltage $V_{dc\_Est}$ of the input terminal of the inverter may be calculated from an equation of $V_{dc\_Est} = V_{n\_Est} \times (\text{PWMduty}_n - 0.5)$, where $V_{n\_Est}$ and PWMduty$_n$ are values corresponding to the same phase, $V_{n\_Est}$ is one of the estimated three-phase voltages, and PWMduty$_n$ is one of the PWM duties.

The step of calculating the estimated three-phase voltages may include converting the three-phase currents into a D-axis current and a Q-axis current that correspond to a fixed coordinate system; converting the D-axis current and the Q-axis current into a d-axis feedback current and a q-axis feedback current that correspond to a synchronous coordinate system. A d-axis estimated voltage and a q-axis estimated voltage are calculated based on the d-axis feedback current and the q-axis feedback current. The d-axis estimated voltage and the q-axis estimated voltage are converted into a D-axis estimated voltage and a Q-axis estimated voltage that correspond to the fixed coordinate system. The D-axis estimated voltage and the Q-axis estimated voltage are converted into estimated three-phase voltages that correspond to a three-phase coordinate system.

The d-axis estimated voltage $V_{d\_Est}$ and the q-axis estimated voltage $V_{q\_Est}$ may be respectively calculated from equations of $$V_{d\_Est} = R_s I_{d\_feedback} + L_d \frac{d}{dt} I_{d\_feedback} - \omega_e L_q I_{q\_feedback}$$

$$V_{q\_Est} = R_s I_{q\_feedback} + L_q \frac{d}{dt} I_{q\_feedback} + \omega_e L_d I_{d\_feedback} + \omega_e \Psi_f,$$

where $I_{d\_feedback}$ is a d-axis feedback current, $I_{q\_feedback}$ is a q-axis feedback current, $R_s$ is a coil resistance of a motor armature, $L_d$ is a d-axis inductance, $\omega_e$ is an electrical angular velocity, $L_q$ is a q-axis inductance, and $\Psi_f$ is a magnetic flux interlinkage of a motor armature.

Only the $\omega_e \Psi_f$ may be calculated to calculate the q-axis estimated voltage when the $I_{d\_feedback}$, the $I_{q\_feedback}$, the $R_s$, the $L_d$, the $\omega_e$, and the $L_q$ are smaller than respectively set reference values.

The estimated three-phase voltages may be calculated from a relationship map of the electrical angular velocity, the three-phase currents, and the three-phase voltage commands if the estimated three-phase voltages calculated from the equations of $$V_{d\_Est} = R_s I_{d\_feedback} + L_d \frac{d}{dt} I_{d\_feedback} - \omega_e L_q I_{q\_feedback}$$

$$V_{q\_Est} = R_s I_{q\_feedback} + L_q \frac{d}{dt} I_{q\_feedback} + \omega_e L_d I_{d\_feedback} + \omega_e \Psi_f$$

based on the d-axis estimated voltage and the q-axis estimated voltage are out of a permissible error range of the experimentally measured three-phase voltages.

The estimated three-phase voltages $V_{a\_Est}$, $V_{b\_Est}$, and $V_{c\_Est}$ may be calculated from an equation of $$\begin{bmatrix} V_{a\_Est} \\ V_{b\_Est} \\ V_{c\_Est} \end{bmatrix} = \begin{bmatrix} R_s + \frac{d}{dt}L_a & \frac{d}{dt}M_{ab} & \frac{d}{dt}M_{ca} \\ \frac{d}{dt}M_{ab} & R_s + \frac{d}{dt}L_b & \frac{d}{dt}M_{bc} \\ \frac{d}{dt}M_{ca} & \frac{d}{dt}M_{bc} & R_s + \frac{d}{dt}L_c \end{bmatrix} \begin{bmatrix} I_a \\ I_b \\ I_c \end{bmatrix} - \begin{bmatrix} \omega_e \Psi_f \sin\theta \\ \omega_e \Psi_f \sin\left(\theta - \frac{2}{3}\pi\right) \\ \omega_e \Psi_f \sin\left(\theta + \frac{2}{3}\pi\right) \end{bmatrix},$$

where $I_a$, $I_b$, and $I_c$ are three-phase currents, $R_s$ is a coil resistance of a motor armature, $L_{a,b,c}$ are magnetic inductances of respective phases, $M_{ab,bc,ca}$ are inter-phase mutual inductances, $\omega_e$ is an electrical angular velocity, $\Psi_f$ is a magnetic flux interlinkage of a motor armature, and $\theta$ is an angle between a d-axis and an a-phase.

Only the $$\begin{bmatrix} \omega_e \Psi_f \sin\theta \\ \omega_e \Psi_f \sin\left(\theta - \frac{2}{3}\pi\right) \\ \omega_e \Psi_f \sin\left(\theta + \frac{2}{3}\pi\right) \end{bmatrix}$$

may be calculated to calculate the estimated three-phase voltages if the $I_a$, $I_b$, and $I_c$, the $R_s$, the $L_{a,b,c}$, the $M_{ab,bc,ca}$, and $\omega_e$ the are smaller than respectively set reference values.

The estimated three-phase voltages may be calculated from a relationship map of the electrical angular velocity, the three-phase currents, and the three-phase voltage commands if the estimated three-phase voltages calculated from the equation of $$\begin{bmatrix} V_{a\_Est} \\ V_{b\_Est} \\ V_{c\_Est} \end{bmatrix} = \begin{bmatrix} R_s + \frac{d}{dt}L_a & \frac{d}{dt}M_{ab} & \frac{d}{dt}M_{ca} \\ \frac{d}{dt}M_{ab} & R_s + \frac{d}{dt}L_b & \frac{d}{dt}M_{bc} \\ \frac{d}{dt}M_{ca} & \frac{d}{dt}M_{bc} & R_s + \frac{d}{dt}L_c \end{bmatrix} \begin{bmatrix} I_a \\ I_b \\ I_c \end{bmatrix} - \begin{bmatrix} \omega_e \Psi_f \sin\theta \\ \omega_e \Psi_f \sin\left(\theta - \frac{2}{3}\pi\right) \\ \omega_e \Psi_f \sin\left(\theta + \frac{2}{3}\pi\right) \end{bmatrix}$$

are out of a permissible error range of the experimentally measured three-phase voltages.

The calculating the voltage of the input terminal of the inverter may include converting the three-phase currents into a D-axis current and a Q-axis current that correspond to a fixed coordinate system. The D-axis current and the Q-axis current are converted into a d-axis feedback current and a q-axis feedback current that correspond to a synchronous coordinate system. A d-axis estimated voltage and a q-axis estimated voltage are calculated based on the d-axis feedback current and the q-axis feedback current; converting the PWM duties into a D-axis PWM duty and a Q-axis PWM duty that correspond to the fixed coordinate system. The D-axis PWM duty and the Q-axis PWM duty are converted into a d-axis PWM duty and a q-axis PWM duty that correspond to the synchronous coordinate system. The voltage $V_{dc\_Est}$ of the input terminal of the inverter may be calculated from an equation of $V_{dc\_Est} = V_{m\_Est} \times (PWMduty_m - 0.5)$, where $V_{m\_Est}$ and $PWMduty_m$ correspond to the same axis, $V_{m\_Est}$ is one of the d-axis estimated voltage and the q-axis estimated voltage, and $PWMduty_m$ is one of the d-axis PWM duty and the q-axis PWM duty.

A motor control method according to an exemplary embodiment of the present invention may include receiving a sensed voltage of an input terminal of an inverter from a voltage sensor. An estimated voltage of the input terminal of the inverter is calculated if the inverter applies a voltage to a motor. An absolute value between the sensed voltage and the estimated voltage is compared with a permissible error reference. An elapsed time after the absolute value exceeds the permissible error reference is counted if the absolute value is greater than the permissible error reference. The voltage sensor is determined to be in a fault state if the elapsed time is greater than a reference time.

The step of calculating the estimated voltage of the input terminal of the inverter may be performed again if the elapsed time is less than or equal to the reference time.

The motor control method may further include resetting the counted elapsed time to zero if the absolute value is less than or equal to the permissible error reference.

The motor control method may further include comparing the sensed voltage with a minimum reference voltage and a maximum reference voltage if the voltage sensor is determined to be in the fault state. a wire of the voltage sensor is determined to be disconnected or short-circuited to a ground if the sensed voltage is less than or equal to the minimum reference voltage. The wire of the voltage sensor is determined to be short-circuited with a power line if the sensed voltage is greater than or equal to the maximum reference voltage.

The motor control method may further include determining that the voltage sensor is in a rationality fault state if the voltage sensor is determined to be in the fault state and the sensed voltage is greater than the minimum reference voltage and less than the maximum reference voltage.

The motor control method may further include controlling the motor in a fail-safe mode using the estimated voltage instead of the sensed voltage if the voltage sensor is determined to be in the fault state.

The motor control method may further include limiting a maximum output speed and a maximum output torque of the motor if the voltage sensor is determined to be in the fault state.

The calculating the estimated voltage of the input terminal of the inverter may include checking three-phase currents flowing from the inverter to the motor, and the estimated voltage of the input terminal of the inverter may be calculated based on a plurality of design parameters, the three-phase currents, and PWM duties for determining switching operations of a plurality of switching elements of the inverter.

The calculating the estimated voltage of the input terminal of the inverter may further include calculating estimated three-phase voltages based on the plurality of design parameters and the three-phase currents. The estimated voltage $V_{dc\_Est}$ of the input terminal of the inverter may be calculated from an equation of $V_{dc\_Est}=V_{n\_Est}\times(\text{PWMduty}_n-0.5)$, where $V_{n\_Est}$ and $\text{PWMduty}_n$ are values corresponding to the same phase, $V_{n\_Est}$ is one of the estimated three-phase voltages, and $\text{PWMduty}_n$ is one of the PWM duties.

The step of calculating the estimated three-phase voltages may include converting the three-phase currents into a D-axis current and a Q-axis current that correspond to a fixed coordinate system. The D-axis current and the Q-axis current are converted into a d-axis feedback current and a q-axis feedback current that correspond to a synchronous coordinate system. A d-axis estimated voltage and a q-axis estimated voltage are calculated based on the d-axis feedback current and the q-axis feedback current. The d-axis estimated voltage and the q-axis estimated voltage are converted into a D-axis estimated voltage and a Q-axis estimated voltage that correspond to the fixed coordinate system. The D-axis estimated voltage and the Q-axis estimated voltage are converted into estimated three-phase voltages that correspond to a three-phase coordinate system. The d-axis estimated voltage $V_{d\_Est}$ and the q-axis estimated voltage $V_{q\_Est}$ may be respectively calculated from equations of $$V_{d\_Est} = R_s I_{d\_feedback} + L_d \frac{d}{dt} I_{d\_feedback} - \omega_e L_q I_{q\_feedback}$$

$$V_{q\_Est} = R_s I_{q\_feedback} + L_q \frac{d}{dt} I_{q\_feedback} - \omega_e L_d I_{d\_feedback} + \omega_e \Psi_f,$$

where $I_{d\_feedback}$ is a d-axis feedback current, $I_{q\_feedback}$ is a q-axis feedback current, $R_s$ is a coil resistance of a motor armature, $L_d$ is a d-axis inductance, $\omega_e$ is an electrical angular velocity, $L_q$ is a q-axis inductance, and $\Psi_f$ is a magnetic flux interlinkage of a motor armature.

Only the $\omega_e \Psi_f$ may be calculated to calculate the q-axis voltage command if the $I_{d\_feedback}$, the $I_{q\_feedback}$) the $R_s$, the $L_d$, the $\omega_e$, and the $L_q$ are smaller than respectively set reference values.

The estimated three-phase voltages may be calculated from a relationship map of the electrical angular velocity, the three-phase currents, and the three-phase voltage commands if the estimated three-phase voltages calculated from the equations of $$V_{d\_Est} = R_s I_{d\_feedback} + L_d \frac{d}{dt} I_{d\_feedback} - \omega_e L_q I_{q\_feedback}$$

$$V_{q\_Est} = R_s I_{q\_feedback} + L_q \frac{d}{dt} I_{q\_feedback} - \omega_e L_d I_{d\_feedback} + \omega_e \Psi_f$$

based on the d-axis estimated voltage and the q-axis estimated voltage are out of a permissible error range of the experimentally measured three-phase voltages.

The estimated three-phase voltages $V_{a\_Est}$, $V_{b\_Est}$, and $V_{c\_Est}$ may be calculated from an equation of $$\begin{bmatrix} V_{a\_Est} \\ V_{b\_Est} \\ V_{c\_Est} \end{bmatrix} = \begin{bmatrix} R_s + \frac{d}{dt}L_a & \frac{d}{dt}M_{ab} & \frac{d}{dt}M_{ca} \\ \frac{d}{dt}M_{ab} & R_s + \frac{d}{dt}L_b & \frac{d}{dt}M_{bc} \\ \frac{d}{dt}M_{ca} & \frac{d}{dt}M_{bc} & R_s + \frac{d}{dt}L_c \end{bmatrix} \begin{bmatrix} I_a \\ I_b \\ I_c \end{bmatrix} -$$

$$\begin{bmatrix} \omega_e \Psi_f \sin\theta \\ \omega_e \Psi_f \sin\left(\theta - \frac{2}{3}\pi\right) \\ \omega_e \Psi_f \sin\left(\theta + \frac{2}{3}\pi\right) \end{bmatrix},$$

where $I_a$, $I_b$, and $I_c$ are three-phase currents, $R_s$ is a coil resistance of a motor armature, $L_{a,b,c}$ are magnetic inductances of respective phases, $M_{ab,bc,ca}$ are inter-phase mutual inductances, $\omega_e$ is an electrical angular velocity, $\Psi_f$ is a magnetic flux interlinkage of a motor armature, and is an angle between a d-axis and an a-phase.

Only the $$\begin{bmatrix} \omega_e \Psi_f \sin\theta \\ \omega_e \Psi_f \sin\left(\theta - \frac{2}{3}\pi\right) \\ \omega_e \Psi_f \sin\left(\theta + \frac{2}{3}\pi\right) \end{bmatrix}$$

may be calculated to calculate the estimated three-phase voltage if the $I_a$, $I_b$, and $I_c$, the $R_s$, the $L_{a,b,c}$, the $M_{ab,bc,ca}$, and the $\omega_e$ are smaller than respectively set reference values.

The estimated three-phase voltages may be calculated from a relationship map of the electrical angular velocity, the three-phase currents, and the three-phase voltage commands if the estimated three-phase voltages calculated from the equation of $$\begin{bmatrix} V_{a\_Est} \\ V_{b\_Est} \\ V_{c\_Est} \end{bmatrix} = \begin{bmatrix} R_s + \frac{d}{dt}L_a & \frac{d}{dt}M_{ab} & \frac{d}{dt}M_{ca} \\ \frac{d}{dt}M_{ab} & R_s + \frac{d}{dt}L_b & \frac{d}{dt}M_{bc} \\ \frac{d}{dt}M_{ca} & \frac{d}{dt}M_{bc} & R_s + \frac{d}{dt}L_c \end{bmatrix} \begin{bmatrix} I_a \\ I_b \\ I_c \end{bmatrix} -$$

$$\begin{bmatrix} \omega_e \Psi_f \sin\theta \\ \omega_e \Psi_f \sin\left(\theta - \frac{2}{3}\pi\right) \\ \omega_e \Psi_f \sin\left(\theta + \frac{2}{3}\pi\right) \end{bmatrix}$$

are out of a permissible error range of the experimentally measured three-phase voltages.

The step of calculating the estimated voltage of the input terminal of the inverter may include converting the three-phase currents into a D-axis current and a Q-axis current that correspond to a fixed coordinate system. The D-axis current and the Q-axis current are converted into a d-axis feedback current and a q-axis feedback current that correspond to a synchronous coordinate system. A d-axis estimated voltage and a q-axis estimated voltage are calculated based on the d-axis feedback current and the q-axis feedback current. The PWM duties are converted into a D-axis PWM duty and a Q-axis PWM duty that correspond to the fixed coordinate system. The D-axis PWM duty and the Q-axis PWM duty are converted into a d-axis PWM duty and a q-axis PWM duty that correspond to the synchronous coordinate system. The estimated voltage $V_{dc\_Est}$ of the input terminal of the inverter is calculated from the equation of $V_{dc\_Est}=V_{m\_Est}\times(\text{PWMduty}_m-0.5)$, where $V_{m\_Est}$ and $\text{PWMduty}_m$ are values that correspond to the same axis, $V_{m\_Est}$ is one of the d-axis estimated voltage and the q-axis estimated voltage, and $PWMduty_m$ is one of the d-axis PWM duty and the q-axis PWM duty.

As described above, according to the exemplary embodiment of the present invention, the voltage of the input terminal of the inverter can be estimated even without a voltage sensor, thereby reducing any additional cost.

When the voltage sensor is provided to measure the voltage of the input terminal of the inverter, the voltage of the input terminal of the inverter can be estimated, thereby effectively determining the fault of the voltage sensor.

In addition, even if the voltage sensor is faulty, the motor can be controlled normally, thereby removing a risk involved in the motor control using the wrongly sensed voltage.

DETAILED DESCRIPTION OF THE EMBODIMENTS

Figure 1:
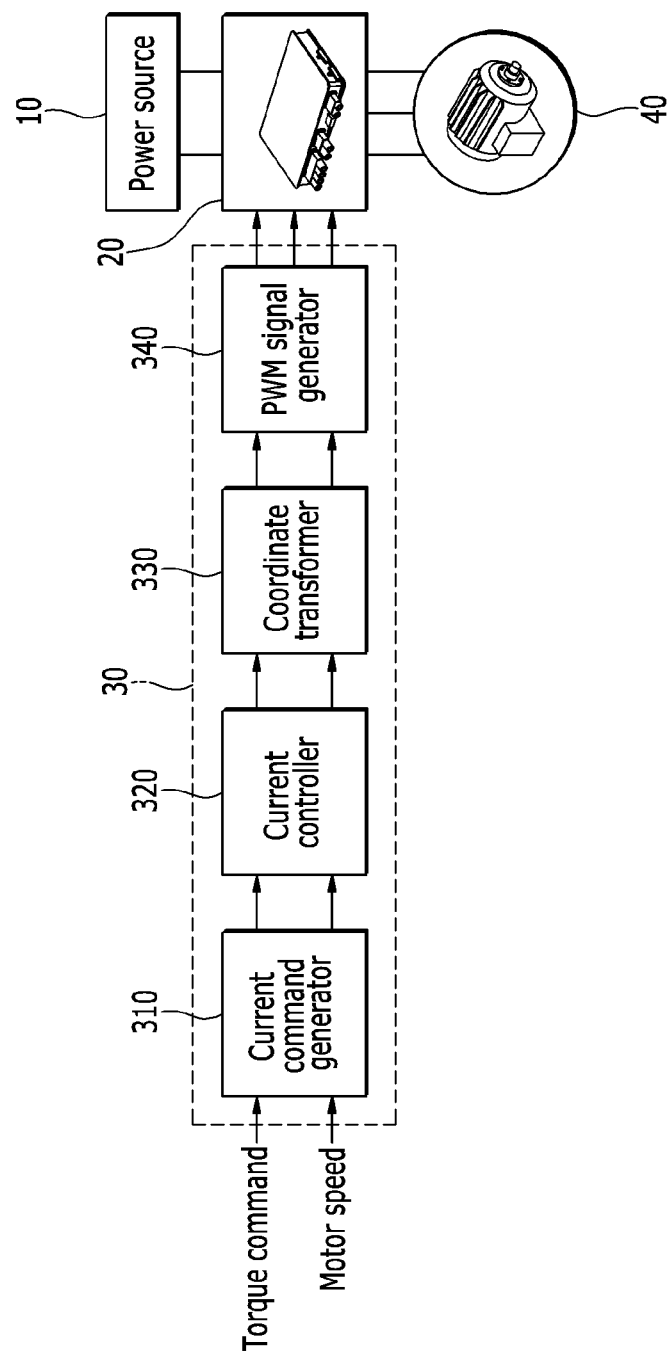
FIG. 1 is a block diagram of a motor control system for torque control according to an exemplary embodiment of the present invention.

The present disclosure will be described more fully hereinafter with reference to the accompanying drawings, in which exemplary embodiments of the invention are shown.

Parts that are irrelevant to the description will be omitted to clearly describe the present invention, and the same or similar constituent elements will be designated by the same reference numerals throughout the specification.

Further, in the drawings, each element is arbitrarily illustrated for convenience of description, and the present invention is not necessarily limited to those illustrated in the drawings.

Figure 2:
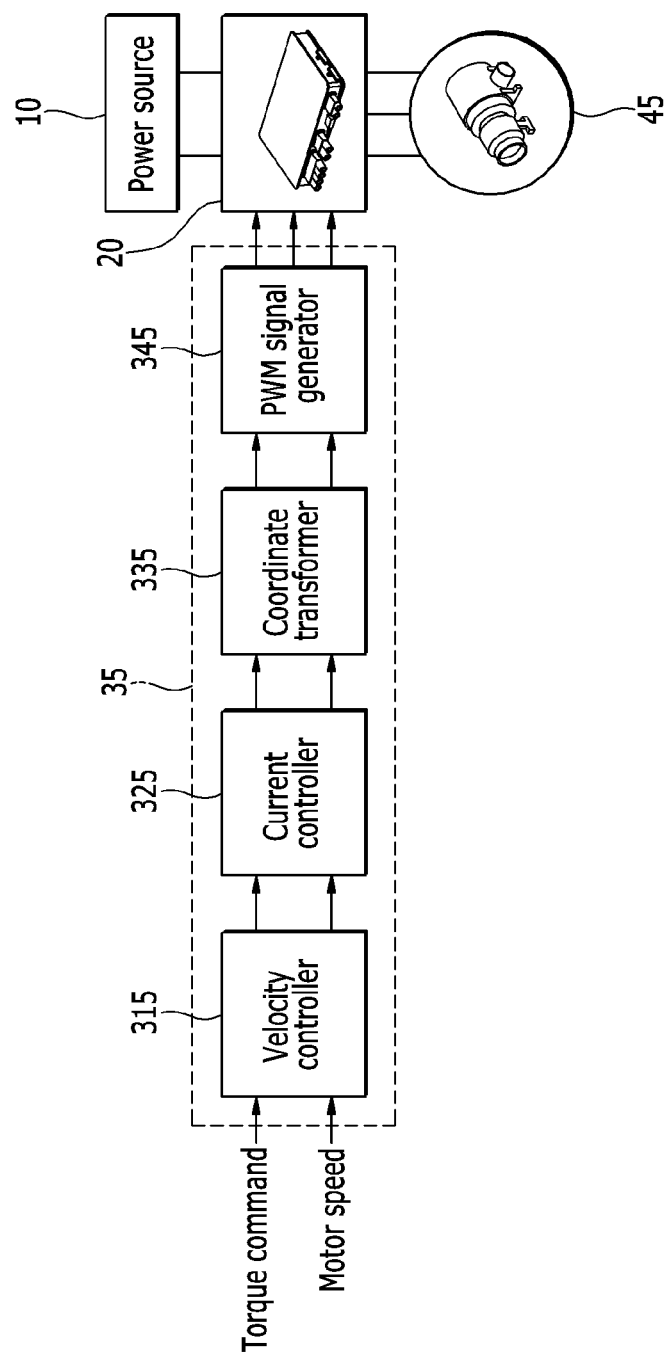
FIG. 2 is a block diagram of a motor control system for speed control according to an exemplary embodiment of the present invention.

FIG. 1 is a block diagram of a motor control system for torque control according to an exemplary embodiment of the present invention. FIG. 2 is a schematic block diagram of a motor control system for speed control according to an exemplary embodiment of the present invention.

As shown in FIG. 1, a motor controller 30 for torque control according to an exemplary embodiment of the present invention may include a current command generator 310, a current controller 320, a coordinate transformer 330, and a pulse-width modulator (PWM) signal generator 340. That is, when a motor 40 is a driving motor for generating driving power of a vehicle, the motor controller 30 may include the current command generator 310 to which torque commands are applied.

Alternatively, as shown in FIG. 2, a motor controller 35 for speed control according to the exemplary embodiment of the present invention may include a velocity controller 315, a current controller 325, a coordinate transformer 335, and a PWM signal generator 345. That is, when a motor 45 is a driving motor for a water pump or air blower, the motor controller 35 may include the velocity controller 315 to which velocity commands are applied.

A description will now be given based on the motor controller 30 for torque control.

Since the motor controller 35 for speed control is similar to the motor controller 30 for controlling the driving motor, except that the velocity controller 315 for speed control to which the velocity commands are applied is further included instead of the current command generator 310, a detailed description will be omitted.

Figure 3:
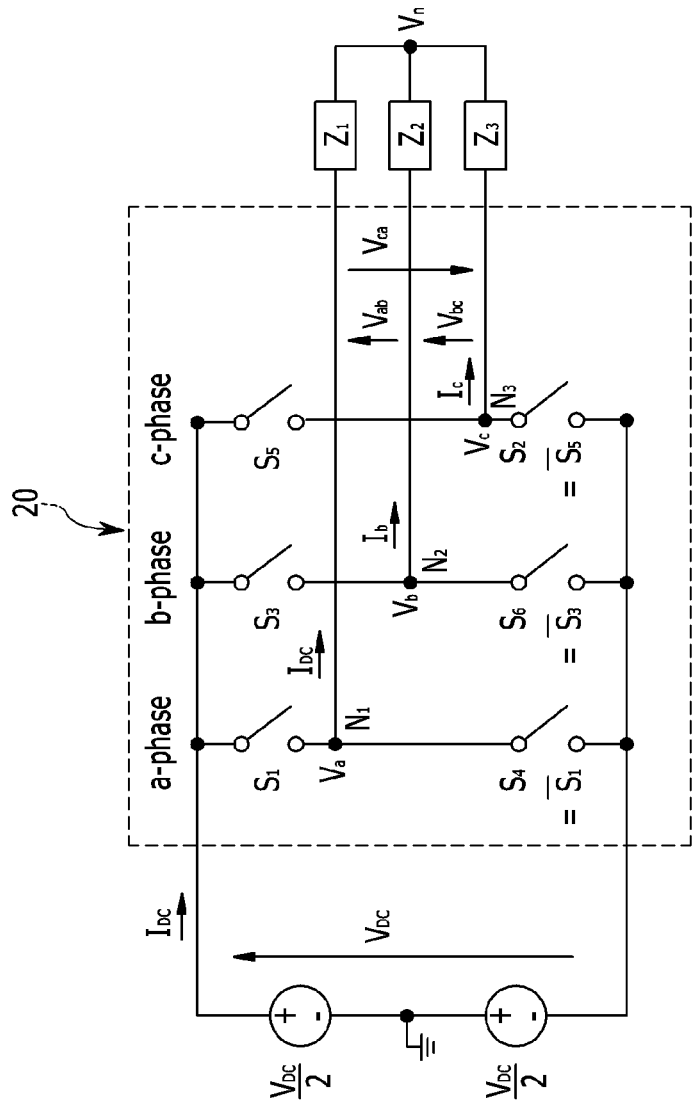
FIG. 3 is a circuit diagram of an inverter according to an exemplary embodiment of the present invention.

FIG. 3 is a drawing of a circuit structure of an inverter according to the according to an exemplary embodiment of the present invention.

As shown in FIG. 3, a driving voltage $V_{DC}$ is applied to an inverter 20.

The inverter 20 includes a plurality of switching elements $S_1$ to $S_6$, and the voltage is supplied to three-phase loads $Z_1$ to $Z_3$ according to switching operations of the switching elements $S_1$ to $S_6$.

The switching element $S_1$, the switching element $S_4$, and the load $Z_1$ are coupled to a node $N_1$. The switching element $S_1$ and the switching element $S_4$ complementarily perform the switching operations. That is, when the switching element $S_1$ is in an on-state, the switching element $S_4$ is in an off-state. When the switching element $S_1$ is turned on, a DC voltage $V_{DC}/2$ is supplied to the load $Z_1$. When the switching element $S_4$ is turned on, a DC voltage $-V_{DC}/2$ is supplied to the load $Z_1$. According to the switching operations of the switching elements $S_1$ and $S_4$, an AC voltage $V_a$ is supplied to the load $Z_1$ and a current $I_a$ flowing through the load $Z_1$ is generated.

The switching element $S_3$, the switching element $S_6$, and the load $Z_2$ are coupled to a node $N_2$. The switching element $S_3$ and the switching element $S_6$ complementarily perform the switching operations. That is, when the switching element $S_3$ is in an on-state, the switching element $S_6$ is in an off-state. When the switching element $S_3$ is turned on, the DC voltage $V_{DC}/2$ is supplied to the load $Z_2$. When the switching element $S_6$ is turned on, the DC voltage $-V_{DC}/2$ is supplied to the load $Z_2$. According to the switching operations of the switching elements $S_3$ and $S_6$, an AC voltage $V_b$ of the node $N_2$ is supplied to the load $Z_2$, and a current $I_b$ flowing through the supply is generated.

The switching element $S_5$, the switching element $S_2$, and the load $Z_3$ are coupled to a node $N_3$. The switching element $S_5$ and the switching element $S_2$ complementarily perform the switching operations. That is, when the switching element $S_5$ is in an on-state, the switching element $S_2$ is in an off-state. When the switching element $S_5$ is turned on, the DC voltage $V_{DC}/2$ is supplied to the load $Z_3$. When the switching element $S_2$ is turned on, the DC voltage $-V_{DC}/2$ is supplied to the load $Z_3$. According to the switching operations of the switching elements $S_5$ and $S_2$, an AC voltage $V_a$ of the node $N_3$ is supplied to the load $Z_3$ and a current $I_c$ flowing through the load $Z_3$ is generated.

The loads $Z_1$ to $Z_3$ are coupled to a neutral node. The switching operations of the switching elements $S_1$ to $S_6$ generate an inter-line voltage $V_{ab}$ between a line of the load $Z_1$ and a line of the load $Z_2$, an inter-line voltage $V_{bc}$ between the line of the load $Z_2$ and a line of the load $Z_3$, and an inter-line voltage $V_{ca}$ between the line of the load $Z_3$ and the line of the load Z1.

The switching operations of the switching elements $S_1$, $S_3$, and $S_5$ have a phase difference of 120° with respect to each other. A phase difference between the switching operations of the switching element $S_1$ and the switching element $S_3$ is 120°, a phase difference between the switching operations of the switching element $S_3$ and the switching element $S_5$ is 120°, and a phase difference between the switching operations of the switching element $S_5$ and the switching element $S_1$ is 120°. Accordingly, a phase difference between the switching operations of the switching element $S_4$ and the switching element $S_6$ is 120°, a phase difference between the switching operations of the switching element $S_6$ and the switching element $S_2$ is 120°, and a phase difference between the switching operations of the switching element $S_2$ and the switching element $S_4$ is 120°.

Figure 4A:
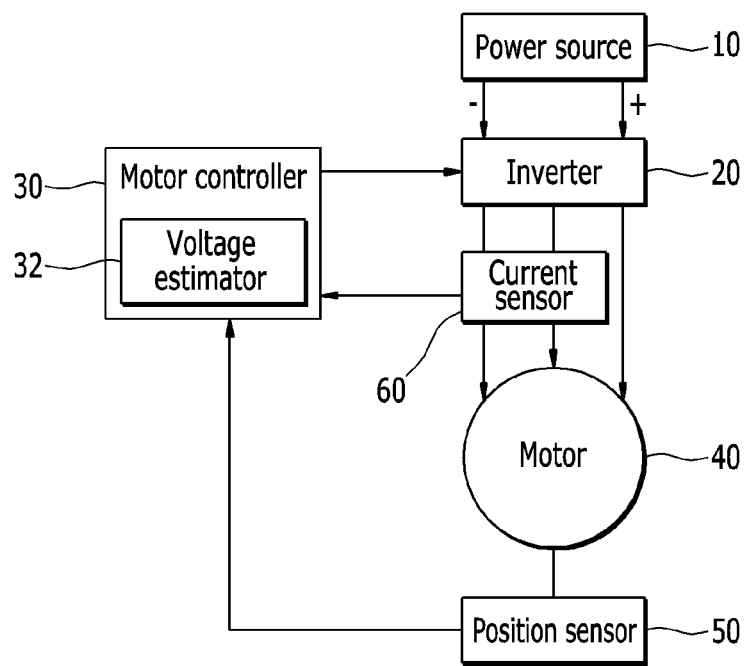
FIGS. 4A and 4B are block diagrams of the motor control system according to the exemplary embodiment of the present invention.
Figure 4B:
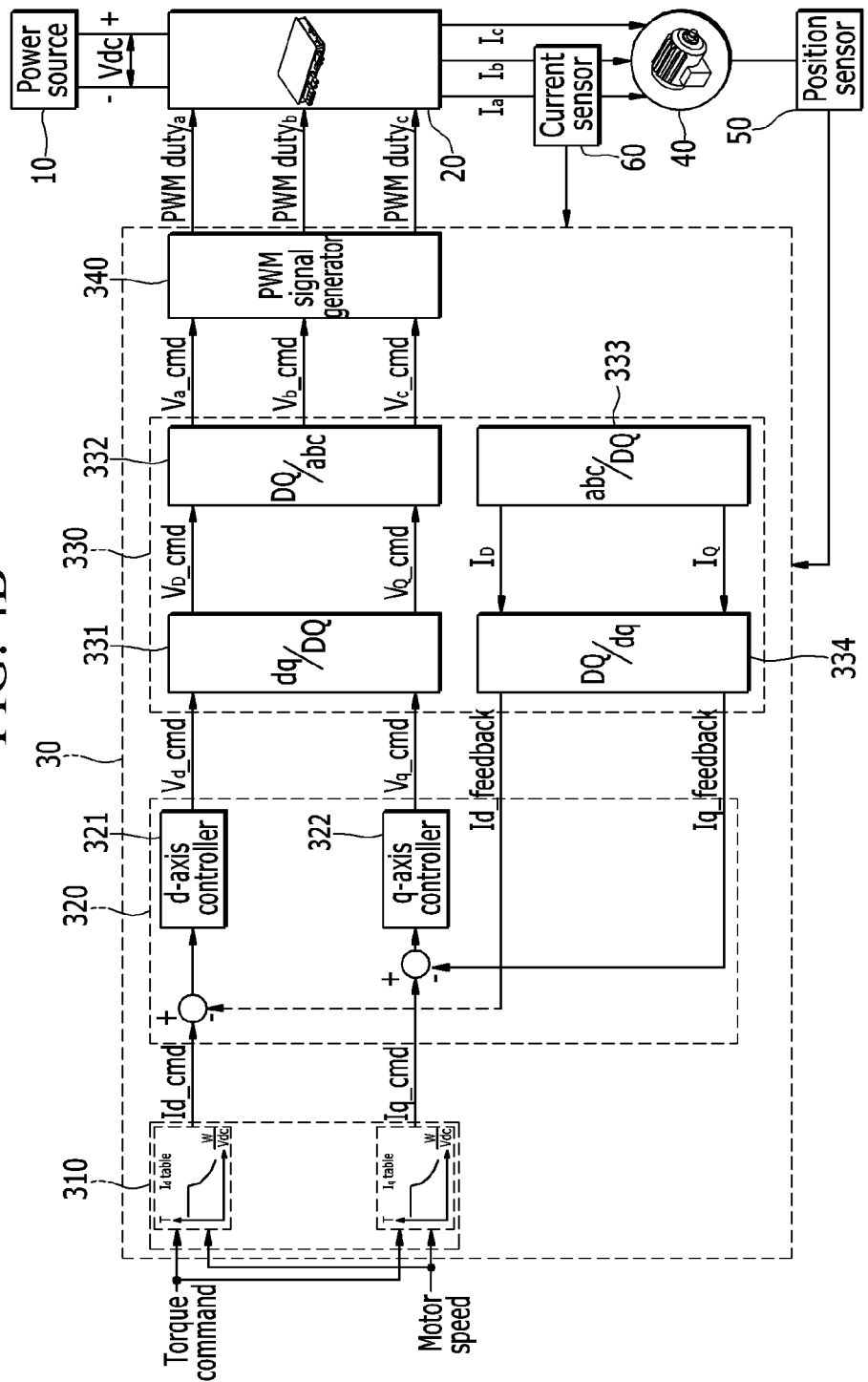

FIGS. 4A and 4B are block diagrams of the motor control system according to the exemplary embodiment of the present invention.

As shown in FIG. 4A, a motor control system according to the exemplary embodiment of the present invention may include a power source 10, an inverter 20, and a motor controller 30.

A driving voltage (DC voltage) is supplied to an input terminal of the inverter 20 from the power source 10, and three-phase currents $I_a$, $I_b$, and $I_c$ are supplied to the motor 40.

The motor controller 30 may be implemented by one or more microprocessors that are operated by a predetermined program, and the predetermined program may include a series of commands for executing respective steps that are included in a method for controlling the inverter 20 and the motor 40 according to the exemplary embodiment of the present invention.

The motor controller 30 may further include a voltage estimator 32 for estimating a voltage of an input terminal of the inverter 20. Alternatively, the voltage estimator 32 may be implemented in a different configuration from that of the motor controller 30. Among processes of a method for estimating the voltage of the input terminal of the inverter 20 according to an exemplary embodiment of the present invention, which will be described later, some processes may perform by the motor controller 30 and some other processes may perform by the voltage estimator 32.

Since the voltage of the input terminal of the inverter 20 can be estimated, it is possible to control the motor 40 even without an additional voltage sensor for measuring the voltage of the input terminal of the inverter 20.

As shown in FIG. 4B, the motor controller 30 according to the exemplary embodiment of the present invention may further include a current command generator 310, a current controller 320, a coordinate transformer 330, and a PWM signal generator 340.

The current command generator 310 determines a d-axis current command $I_{d\_cmd}$ and a q-axis current command $I_{q\_cmd}$ depending on driving conditions of the vehicle. The current command generator 310 has a d-axis current map and a q-axis current map. When receiving a torque command T and a speed w of the motor 40 that are required in a current driving condition the vehicle, the current command generator 310 outputs the d-axis current command $I_{d\_cmd}$ and the q-axis current command $I_{q\_cmd}$ that correspond to the torque command T and the speed w.

The current controller 320 includes a d-axis controller 321 and a q-axis controller 322. The d-axis controller 321 outputs a d-axis voltage command $V_{d\_cmd}$ using the d-axis current command $I_{d\_cmd}$ received from the current command generator 310 and a d-axis feedback current $I_{d\_feedback}$ received from the coordinate transformer 330. The q-axis controller 322 outputs a q-axis voltage command $V_{q\_cmd}$ using the q-axis current command $I_{q\_cmd}$ received from the current command generator 310 and a q-axis feedback current $I_{q\_feedback}$ received from the coordinate transformer 330. The d-axis controller 321 and the q-axis controller 322 may be implemented by a proportional integral (PI) controller.

The coordinate transformer 330 converts the d-axis voltage command $V_{d\_cmd}$ and the q-axis voltage command $V_{q\_cmd}$ that are received from the current controller 320 into three-phase voltage commands $V_{a\_cmd}$, $V_{b\_cmd}$, and $V_{c\_cmd}$. Further, the coordinate transformer 330 converts the three-phase currents $I_a$, $I_b$, and $I_c$ flowing from the inverter 20 to the motor 40 into the d-axis feedback current $I_{d\_feedback}$ and the q-axis feedback current $I_{q\_feedback}$. The three-phase currents $I_a$, $I_b$, and $I_c$ may be measured by a current sensor 60. Alternatively, the current sensor 60 may measure the two-phase currents from the three-phase currents $I_a$, $I_b$, and $I_c$, and the motor controller 30 may measure the remaining one-phase current.

The coordinate transformer 330 includes a synchronous/fixed coordinate transformer 331, a fixed/three-phase coordinate transformer 332, and a three-phase/fixed coordinate transformer 333, and a fixed/synchronous coordinate transformer 334. In order to easily design the motor controller 30, a three-phase coordinate system [a,b,c] in which an a-phase, a b-phase, and a c-phase are formed at an interval of 120° from each other is coordinate-transformed.

A fixed coordinate system [D,Q] is set based on a three-phase coil that is wound at a stator of the motor 40. A D-axis is a coil direction of an a-phase of the stator, and a Q-axis is a direction that is perpendicular to the coil direction of the a-phase of the stator in terms of an electrical angle.

A synchronous coordinate system [d,q] is a rotating coordinate system that is synchronized with a permanent magnet of a rotor. A d-axis is an N-pole direction of the permanent magnet of the rotor, and a q-axis is a direction that is perpendicular to the N-pole direction of the permanent magnet of the rotor in terms of the electrical angle.

Based on a position of the rotor of the motor 40 that is received from a position sensor 50, the synchronous/fixed coordinate transformer 331 converts the d-axis voltage command $V_{d\_cmd}$ and the q-axis voltage command $V_{q\_cmd}$ into the D-axis voltage command $V_{D\_cmd}$ and the Q-axis voltage command $V_{Q\_cmd}$ that correspond to the fixed coordinate system [D,Q].

The fixed/three-phase coordinate transformer 332 converts the D-axis voltage command $V_{D\_cmd}$ and the q-axis voltage command $V_{Q\_cmd}$ into the three-phase voltage commands $V_{a\_cmd}$, $V_{b\_cmd}$, and $V_{c\_cmd}$ that correspond to the three-phase coordinate system [a, b, c].

The three-phase/fixed coordinate transformer 333 converts the three-phase currents $I_a$, $I_b$, and $I_c$ into a D-axis current $I_D$ and a Q-axis current $I_Q$ that correspond to the fixed coordinate system [D,Q].

Based on the position of the rotor of the motor 40 that is received from the position sensor 50, the fixed/synchronous coordinate transformer 334 converts the D-axis current $I_D$ and the Q-axis current $I_Q$ into the d-axis feedback current $I_{d\_feedback}$ and the q-axis feedback current $I_{q\_feedback}$ that correspond to the synchronous coordinate system [d,q].

Based on the three-phase voltage commands $V_{a\_cmd}$, $V_{b\_cmd}$, and $V_{c\_cmd}$ that are received from the coordinate transformer 330, the PWM signal generator 340 determines PWM duties $PWMduty_a$, $PWMduty_b$, and $PWMduty_c$.

The PWM duties PWMduty$_a$, PWMduty$_b$, and PWMduty$_c$ may be set to have values between 0 and 1 (0<PWMduty$_{a,b,c}$<1). The PWM duties PWMduty$_a$, PWMduty$_b$, and PWMduty$_c$ may be set to 0 when a duty ratio (a ratio of a switching cycle to a turned-on time of the switching element) is 0% and to 1 when the duty ratio is 100%.

The switching elements S$_1$ to S$_6$ of the inverter 20 perform switching operations according to the determined PWM duties PWMduty$_a$, PWMduty$_b$, and PWMduty$_c$, and the three-phase currents I$_a$, I$_b$, and I$_c$ flow to the motor 40 from the inverter 20.

Figure 5A:
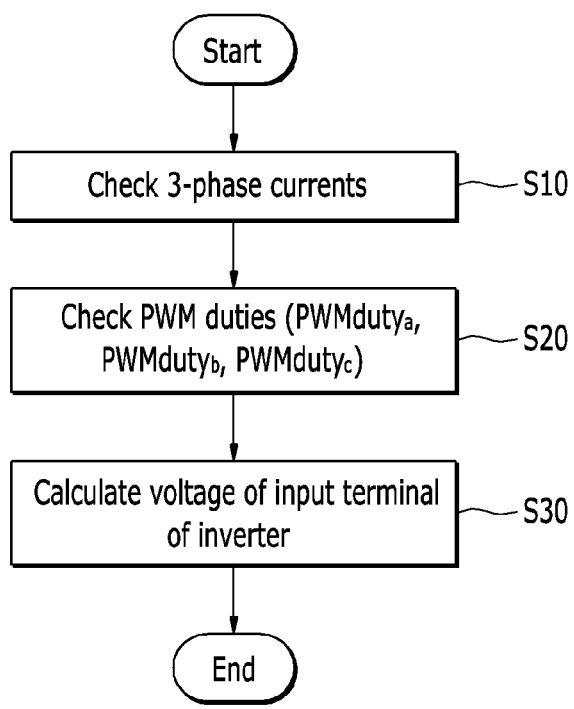
FIGS. 5A and 5B are flowcharts illustrating a method for estimating a voltage of an input terminal of an inverter according to an exemplary embodiment of the present invention.
Figure 5B:
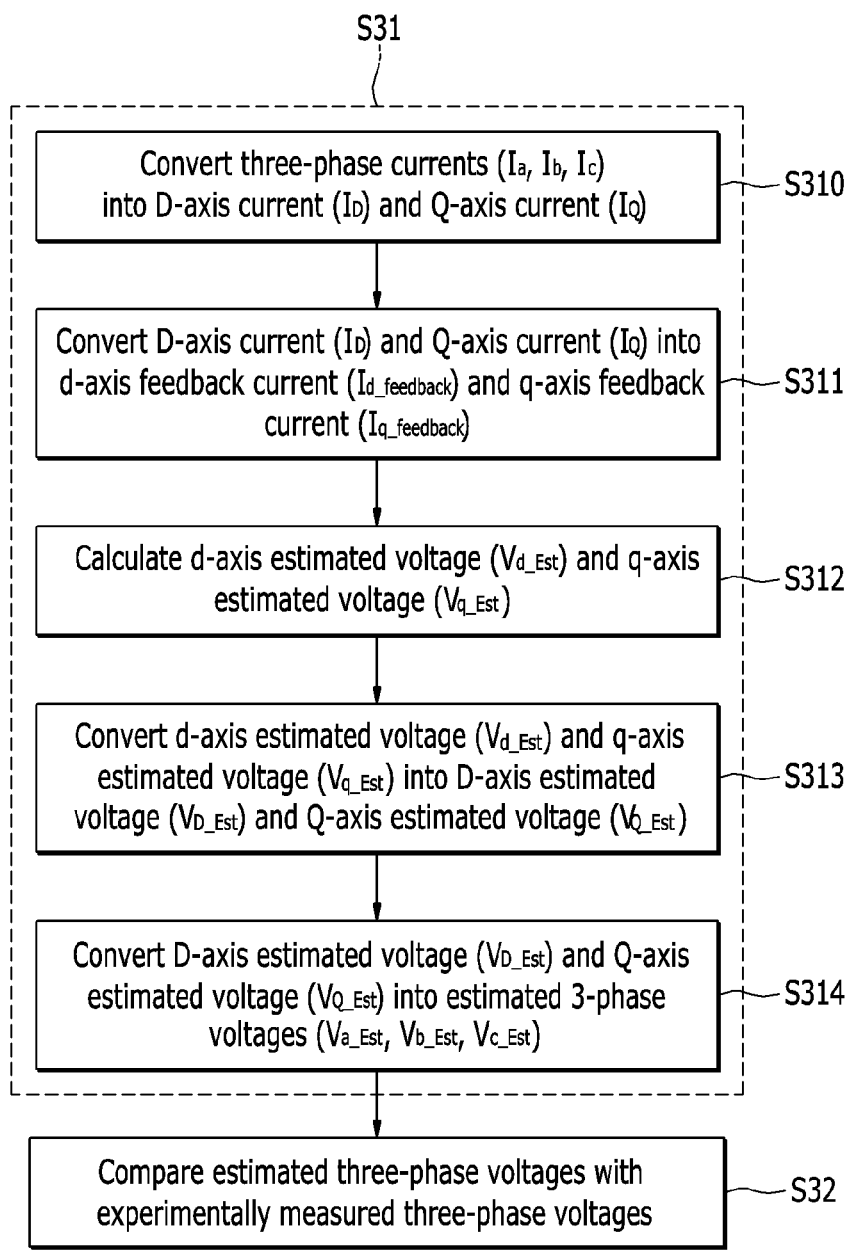

FIGS. 5A and 5B are flowcharts illustrating a method for estimating a voltage of an input terminal of an inverter according to an exemplary embodiment of the present invention.

Referring to FIGS. 5A and 5B, a voltage estimator 32 checks three-phase currents I$_a$, I$_b$, and I$_c$ that flow from an inverter 20 to a motor 40 (S10). The two-phase currents among the three-phase currents I$_a$, I$_b$, and I$_c$ are measured by a current sensor 60, and the remaining one-phase current may be calculated to have a value that makes a sum of the three-phase currents zero.

The voltage estimator 32 checks PWM duties PWMduty$_a$, PWMduty$_b$, and PWMduty$_c$ that determine switching operations of switching elements S$_1$ to S$_6$ of the inverter 20 (S20). The PWM duties PWMduty$_a$, PWMduty$_b$, and PWMduty$_c$ are determined by a PWM signal generator 340 based on three-phase voltage commands V$_{a\_cmd}$, V$_{b\_cmd}$, and V$_{c\_cmd}$.

The voltage estimator 32 may calculate a voltage of an input terminal of the inverter 20 based on a plurality of design parameters, the three-phase currents I$_a$, I$_b$, and I$_c$, and the PWM duties PWMduty$_a$, PWMduty$_b$, and PWMduty$_c$ (S30).

The voltage estimator 32 may calculate estimated three-phase voltages V$_{a\_Est}$, V$_{b\_Est}$, and V$_{c\_Est}$ based on the plurality of design parameters and the three-phase currents I$_a$, I$_b$, and I$_c$ (S31).

The voltage estimator 32 may convert the three-phase currents I$_a$, I$_b$, and I$_c$ into a D-axis current I$_D$ and a Q-axis current I$_Q$ that correspond to a fixed coordinate system [D,Q] (S310), and may convert the D-axis current I$_D$ and the Q-axis current I$_Q$ into a d-axis feedback current I$_{d\_feedback}$ and a q-axis feedback current I$_{q\_feedback}$ that correspond to a synchronous coordinate system [d,q] (S311).

Using Equation 1 below, the voltage estimator 32 may calculate a d-axis estimated voltage V$_{d\_Est}$ and a q-axis estimated voltage V$_{q\_Est}$ (S312). Equation 1 is a motor voltage equation based on the synchronous coordinate system.

$$V_{d\_Est} = R_s I_{d\_feedback} + L_d \frac{d}{dt} I_{d\_feedback} - \omega_e L_q I_{q\_feedback}$$

$$V_{q\_Est} = R_s I_{q\_feedback} + L_q \frac{d}{dt} I_{q\_feedback} + \omega_e L_d I_{d\_feedback} + \omega_e \Psi_f,$$

[Equation 1]

where R$_s$ is a coil resistance of a motor armature, L$_d$ is a d-axis inductance, $\omega_e$ is an electrical angular velocity, L$_q$ is a q-axis inductance, and $\Psi_f$ is a magnetic flux interlinkage of the motor armature.

The coil resistance of the motor armature R$_s$, the d-axis inductance L$_d$, the q-axis inductance L$_q$, and the magnetic flux interlinkage of the motor armature $\Psi_f$ can be experimentally pre-calculated as the design parameters, and the electrical angular velocity $\omega_e$ can be obtained from the position sensor 50.

The voltage estimator 32 converts the d-axis estimated voltage V$_{d\_Est}$ and the q-axis estimated voltage V$_{q\_Est}$ calculated by using Equation 1 into the D-axis estimated voltage V$_{D\_Est}$ and the Q-axis estimated voltage V$_{Q\_Est}$ that correspond to the fixed coordinate system [D,Q] (S313), and may convert the D-axis estimated voltage V$_{D\_Est}$ and the Q-axis estimated voltage V$_{Q\_Est}$ into estimated three-phase voltages V$_{a\_Est}$, V$_{b\_Est}$, and V$_{c\_Est}$ that correspond to a three-phase coordinate system [a,b,c] (S314).

Based on the estimated three-phase voltages V$_{a\_Est}$, V$_{b\_Est}$, and V$_{c\_Est}$ and the PWM duties PWMduty$_a$, PWMduty$_b$, and PWMduty$_c$, the voltage estimator 32 may calculate the voltage of the input terminal of the inverter 20 using Equation 2.

$$V_{dc\_Est} = V_{n\_Est} \times (\text{PWMduty}_n - 0.5),$$ [Equation 2]

where V$_{n\_Est}$ and PWMduty$_n$ are values corresponding to the same phase, V$_{n\_Est}$ is one of the estimated three-phase voltages V$_{a\_Est}$, V$_{b\_Est}$, and V$_{c\_Est}$, and PWMduty$_n$ is one of the PWM duties PWMduty$_a$, PWMduty$_b$, and PWMduty$_c$.

Unlike a coordinate-transforming method, the voltage estimator 32 may calculate the estimated three-phase voltages V$_{a\_Est}$, V$_{b\_Est}$, and V$_{c\_Est}$ using Equation 3. Equation 3 is a motor voltage equation based on the three-phase coordinate system.

$$\begin{bmatrix} V_{a\_Est} \\ V_{b\_Est} \\ V_{c\_Est} \end{bmatrix} = \begin{bmatrix} R_s + \frac{d}{dt}L_a & \frac{d}{dt}M_{ab} & \frac{d}{dt}M_{ca} \\ \frac{d}{dt}M_{ab} & R_s + \frac{d}{dt}L_b & \frac{d}{dt}M_{bc} \\ \frac{d}{dt}M_{ca} & \frac{d}{dt}M_{bc} & R_s + \frac{d}{dt}L_c \end{bmatrix} \begin{bmatrix} I_a \\ I_b \\ I_c \end{bmatrix} - \begin{bmatrix} \omega_e \Psi_f \sin\theta \\ \omega_e \Psi_f \sin\left(\theta - \frac{2}{3}\pi\right) \\ \omega_e \Psi_f \sin\left(\theta + \frac{2}{3}\pi\right) \end{bmatrix},$$

[Equation 3]

where R$_s$ is a coil resistance of a motor armature, L$_{a,b,c}$ are magnetic inductances of respective phases, M$_{ab,bc,ca}$ are inter-phase mutual inductances, $\omega_e$ is an electrical angular velocity, $\Psi_f$ is a magnetic flux interlinkage of a motor armature, and $\theta$ is an angle between a d-axis and an a-phase.

The coil resistance of the motor armature R$_s$, the magnetic inductances of the respective phases L$_{a,b,c}$, the inter-phase mutual inductances M$_{ab,bc,ca}$, and the magnetic flux interlinkage $\Psi_f$ of the motor armature can be experimentally pre-calculated as the design parameters, and the electrical angular velocity $\omega_e$ and the angle $\theta$ between the d-axis and the a-phase can be obtained from the position sensor 50.

Since Equation 3 has more design parameters than Equation 1, it is more efficient to coordinate-transform the d-axis estimated voltage V$_{d\_Est}$ and the q-axis estimated voltage V$_{q\_Est}$.

$\omega_e \Psi_f$ of Equation 1 and $$\begin{bmatrix} \omega_e \Psi_f \sin\theta \\ \omega_e \Psi_f \sin\left(\theta - \frac{2}{3}\pi\right) \\ \omega_e \Psi_f \sin\left(\theta + \frac{2}{3}\pi\right) \end{bmatrix}$$

of Equation 3 are counter electromotive force components that are generated as the magnetic flux generated from the permanent magnet of the rotor passes through a coil of a stator when the motor 40 rotates. When the coil resistance of the motor armature, the inductance components, the currents flowing through the three-phase coil, and the electrical angular velocity are small, only the counter electromotive force components become a determining value. Thus, when the coil resistance of the motor armature $R_s$, the inductance components $L_d$, $L_q$, $L_{a,b,c}$, and $M_{ab,bc,ca}$, the three-phase currents $I_a$, $I_b$, and $I_c$, the d-axis feedback current $I_{d\_feedback}$, the q-axis feedback current $I_{q\_feedback}$ and the electrical angular velocity $\omega_e$ are smaller than respectively set reference values, the other values are ignored except for the counter electromotive force components such that only the counter electromotive force components are calculated, thereby calculating the q-axis estimated voltage $V_{d\_Est}$ and the estimated three-phase voltages $V_{a\_Est}$, $V_{b\_Est}$, and $V_{c\_Est}$.

The voltage estimator 32 may compare the estimated three-phase voltages $V_{a\_Est}$, $V_{b\_Est}$, and $V_{c\_Est}$ with the experimentally measured three-phase voltages (S32). Due to a problem related to a design of the motor 40 or non-linearity of the plurality of design parameters, errors may occur between the estimated three-phase voltages calculated by using Equation 1 or Equation 3 and the measured three-phase voltages. When the estimated three-phase voltages are out of a permissible error range of the measured three-phase voltages, the voltage estimator 32 may calculate the estimated three-phase voltages $V_{a\_Est}$, $V_{b\_Est}$, and $V_{c\_Est}$ from a relationship map of the electrical angular velocity, the three-phase currents $I_a$, $I_b$, and $I_c$, and the three-phase voltage commands $V_{a\_cmd}$, $V_{b\_cmd}$, and $V_{c\_cmd}$. The map may be preset by repeated experiments.

Further, the voltage estimator 32 may calculate the voltage of the input terminal of the inverter 20 by using Equation 4 based on the d-axis estimated voltage $V_{d\_Est}$, the q-axis estimated voltage $V_{q\_Est}$, a d-axis PWM duty, and a q-axis PWM duty.

Since the PWM duties PWMduty$_a$, PWMduty$_b$, and PWMduty$_c$ can be seen as vector components, the PWM duties PWMduty$_a$, PWMduty$_b$, and PWMduty$_c$ are coordinate-transformed twice (the three-phase coordinate system [a,b,c]=>the fixed coordinate system [D,Q]=>the synchronous coordinate system [d,q]), thereby calculating the d-axis PWM duty and the q-axis PWM duty.

$$V_{dc\_Est} = V_{m\_Est}(\text{PWMduty}_m - 0.5),\qquad [\text{Equation 4}]$$

where $V_{m\_Est}$ and PWMduty$_m$ are values corresponding to the same axis, $V_{m\_Est}$ is one of the d-axis estimated voltage $V_{d\_Est}$ and the q-axis estimated voltage $V_{q\_Est}$, and PWMduty$_m$ is one of the d-axis PWM duty and the q-axis PWM duty.

Figure 8:
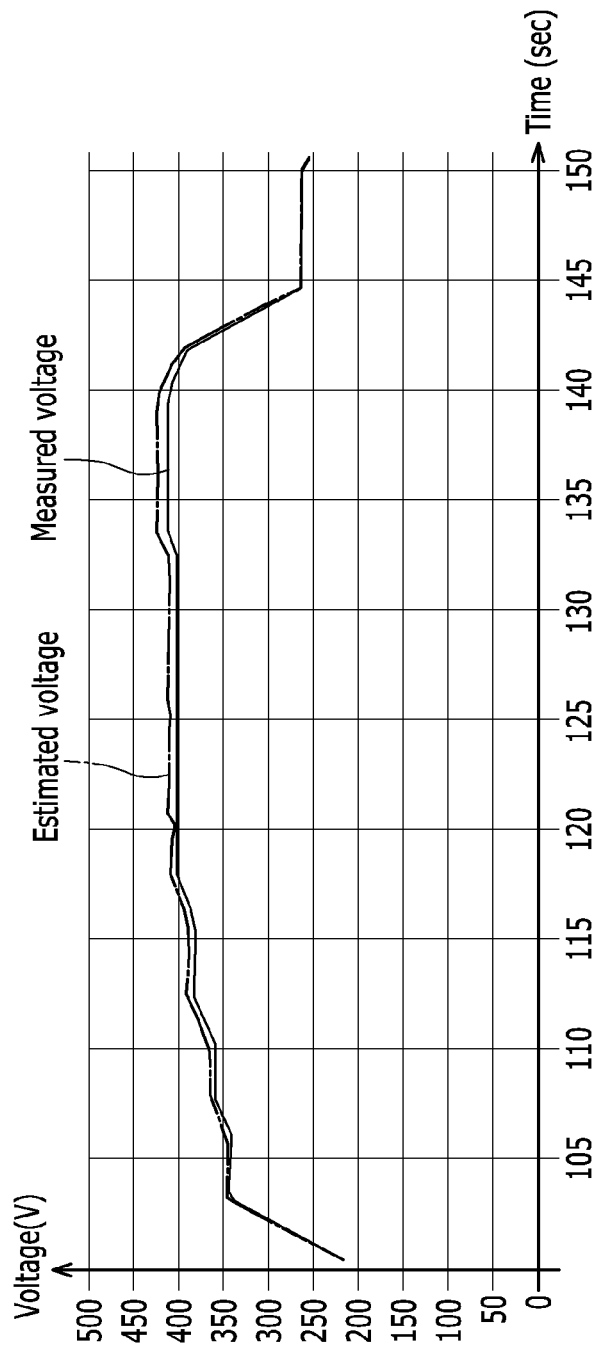
FIG. 8 is a graph in which an estimated voltage according to the exemplary embodiment of the present invention and a measured voltage are compared.
Figure 9A:
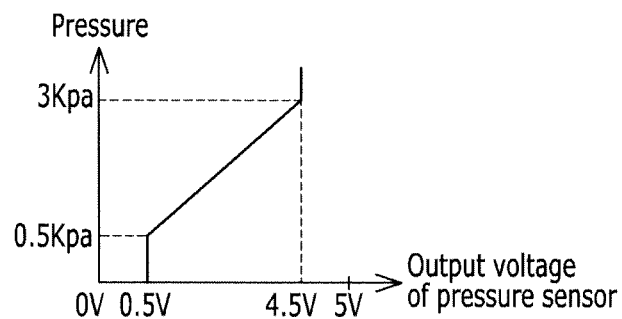
FIGS. 9(a) and 9(b) are drawings in which a general sensor and a voltage sensor are compared.
Figure 9B:
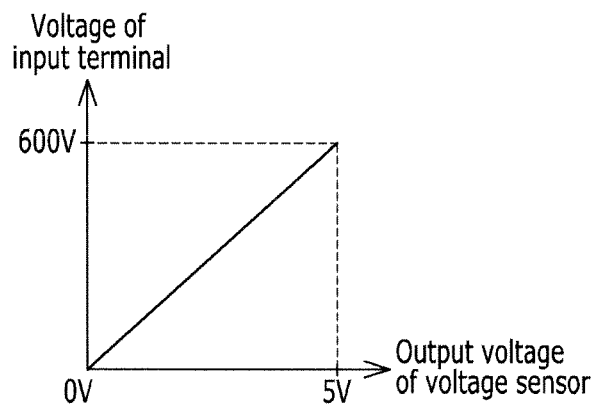

FIG. 8 is a graph in which an estimated voltage according to the exemplary embodiment of the present invention and a measured voltage are compared.

As shown in FIG. 8, even under a condition where the voltage of the input terminal of the inverter 20 varies, it can be verified that the calculated estimated voltages and the measured voltages are within the error range.

Figure 6A:
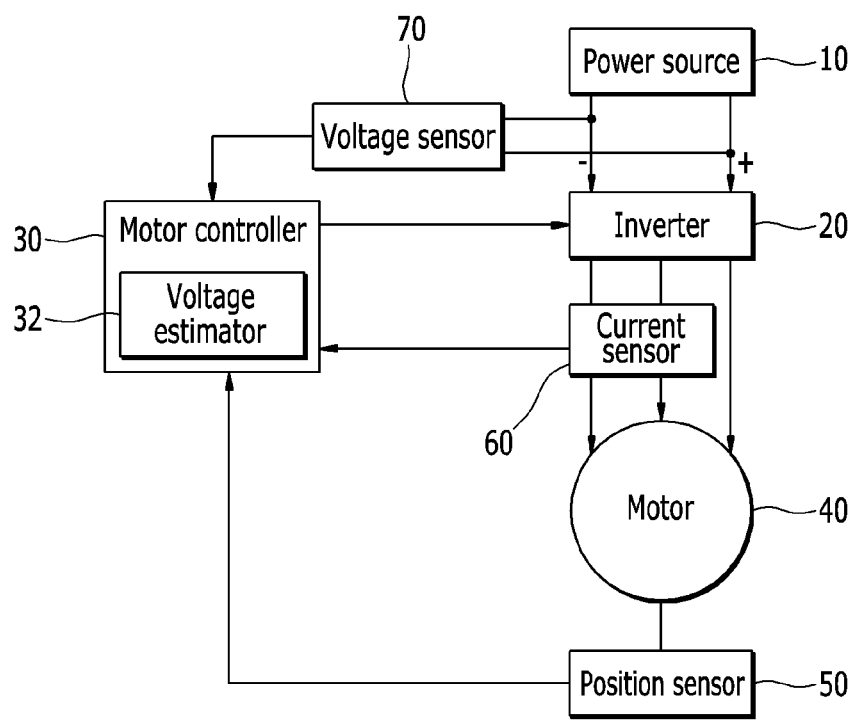
FIGS. 6A and 6B are block diagrams of a motor control system according to another exemplary embodiment of the present invention.
Figure 6B:
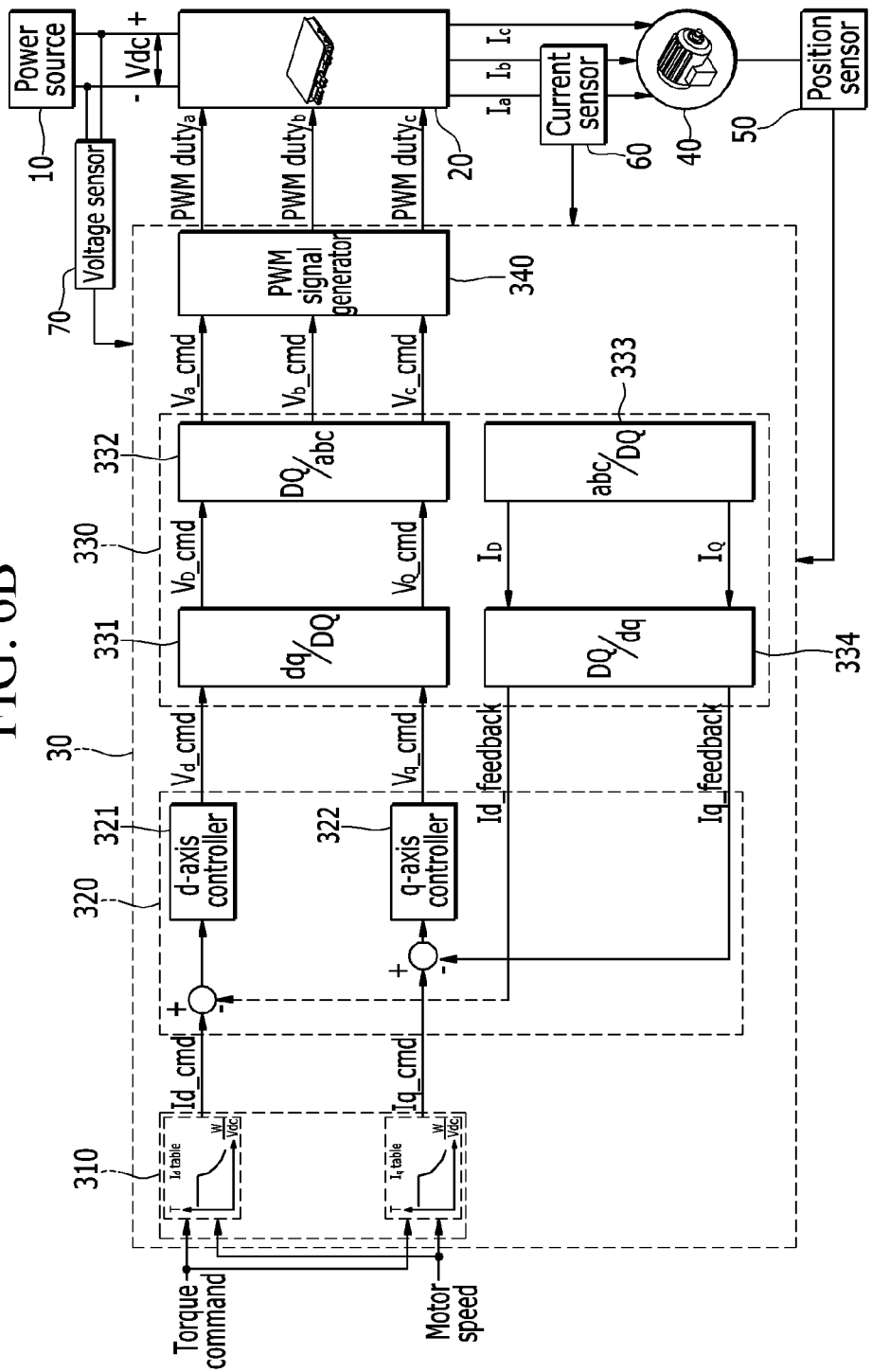

FIGS. 6A and 6B are block diagrams of a motor control system according to another exemplary embodiment of the present invention.

Referring to FIGS. 6A and 6B, since a motor control system according to the current embodiment of the present invention is similar to the motor control system according to the previous exemplary embodiment of the present invention, except for an additional voltage sensor 70, a detailed description will be omitted.

The voltage sensor 70 of the motor control system according to the current exemplary embodiment of the present invention may be sufficient if it can measure the voltage of the input terminal of the inverter 20. For example, the voltage sensor 70 may be replaced by a voltage sensing circuit that is formed on a substrate. Thus, it is to be understood that the voltage sensor 70 can include any device that can measure the voltage of the input terminal of the inverter 20.

Among processes for determining a fault state of the voltage sensor 70 according to the exemplary embodiment of the present invention and controlling the motor 50 in a fail-safe mode, which will be described later, some processes may be performed by the motor controller 30 and some other processes may be performed by the voltage estimator 32.

Figure 7:
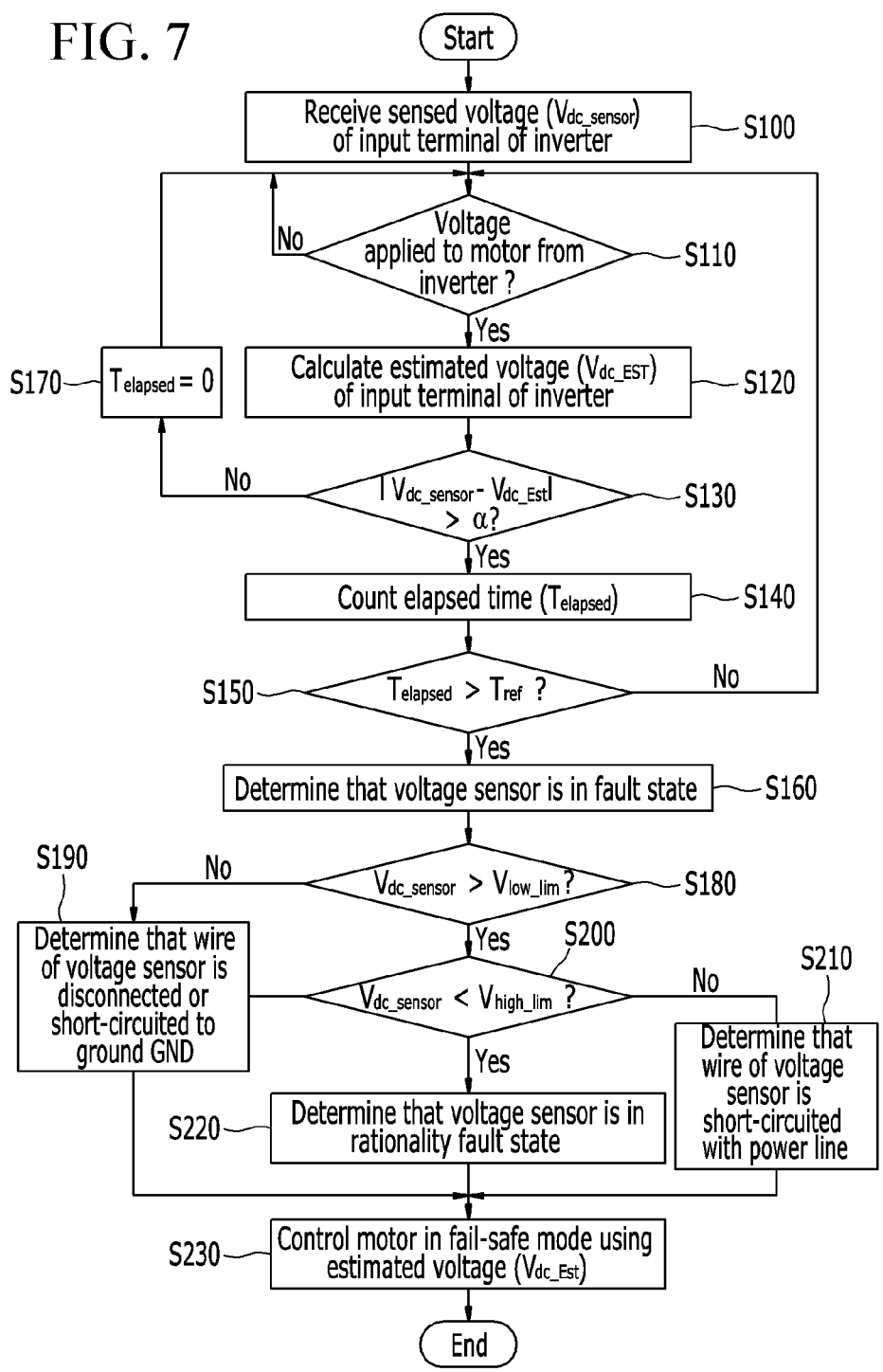
FIG. 7 is a flowchart of a motor control method according to another exemplary embodiment of the present invention.

FIG. 7 is a flowchart of a motor control method according to another exemplary embodiment of the present invention.

Referring to FIG. 7, the voltage estimator 32 receives a sensed voltage $U_{dc\_sensor}$ of the input terminal of the inverter 20 from the voltage sensor 70 (S100).

The voltage estimator 32 determines whether the inverter 20 applies the voltage to the motor 40 according to the switching operations of the switching elements $S_1$ to $S_6$ (S110).

If the voltage is not applied to the motor 40 from the inverter 20, the voltage of the input terminal of the inverter 20 cannot be estimated using Equation 2.

If the voltage is applied to the motor 40 from the inverter 20, the voltage estimator 32 calculates an estimated voltage $V_{dc\_Est}$ of the input terminal of the inverter 20 (S120). The estimated voltage $V_{dc\_Est}$ may be calculated by the method that has been described with reference to FIGS. 5A and 5B.

The voltage estimator 32 compares the sensed voltage $V_{dc\_Sensor}$ and the estimated voltage $V_{dc\_Est}$ (S130). If the motor 40 is controlled normally, the sensed voltage $V_{dc\_Sensor}$ and the estimated voltage $V_{dc\_Est}$ should be within the error range. The voltage estimator 32 may compare an absolute value between the sensed voltage $V_{dc\_Sensor}$ and the estimated voltage $V_{dc\_Est}$ with the permissible error reference $\alpha$. Due to measurement errors of sensors, design errors, etc., there may be a difference between the sensed voltage $V_{dc\_Sensor}$ and the estimated voltage $V_{dc\_Est}$. The permissible error reference $\alpha$ may be determined by experiments to have a value that a person of ordinary skill in the art determines.

To compare the sensed voltage $V_{dc\_Sensor}$ with the estimated voltage $V_{dc\_Est}$, the voltage estimator 32 may use various analysis techniques (e.g., standard deviation, variance, etc.) instead of the absolute value and the permissible error reference $\alpha$.

If the absolute value between the sensed voltage $V_{dc\_Sensor}$ and the estimated voltage $V_{dc\_Est}$ is greater than the permissible error reference $\alpha$, the voltage estimator 32 counts an elapsed time $T_{elapsed}$ after the absolute value exceeds the permissible error reference $\alpha$ (S140).

The voltage estimator 32 may compare the elapsed time $T_{elapsed}$ and a reference time $T_{ref}$ (S150). The reference time $T_{ref}$ may be determined by experiments to have a value that a person of ordinary skill in the art determines.

If the elapsed time $T_{elapsed}$ is greater than the reference time $T_{ref}$, the voltage estimator 32 may determine that the voltage sensor 70 is in a fault state (S160).

The voltage estimator 32 restarts from step S110 if the elapsed time $T_{elapsed}$ is less than or equal to the reference time $T_{ref}$. In step S130, if the absolute value between the sensed voltage $V_{dc\_Sensor}$ and the estimated voltage $V_{dc\_Est}$ is less than or equal to the permissible error reference $\alpha$, the voltage estimator 32 may reset the counted elapsed time $T_{elapsed}$ to zero (S170).

If the voltage sensor 70 is determined to be in the fault state, the voltage estimator 32 compares the sensed voltage $V_{dc\_Sensor}$ and a minimum reference voltage $V_{low\_lim}$ (S180). The minimum reference voltage $V_{low\_lim}$ may be set by a person of ordinary skill in the art in consideration of the sensed voltage that is detected in a state where a wire of the voltage sensor 70 is disconnected or is short-circuited to a ground GND.

If the sensed voltage $V_{dc\_Sensor}$ is less than or equal to the minimum reference voltage $V_{low\_lim}$, the voltage estimator 32 may determine that the wire of the voltage sensor 70 is disconnected or short-circuited to the ground GND (S190).

If the voltage sensor 70 is determined to be in the fault state, the voltage estimator 32 compares the sensed voltage $V_{dc\_Sensor}$ and a maximum reference voltage $V_{high\_lim}$ (S200). The maximum reference voltage $V_{high\_lim}$ may be set by a person of ordinary skill in the art in consideration of the sensed voltage that is detected in a state where the wire of the voltage sensor 70 is short-circuited with a power line.

If the sensed voltage $V_{dc\_Sensor}$ is greater than or equal to the maximum reference voltage $V_{high-lim}$, the voltage estimator 32 may determine that the wire of the voltage sensor 70 is short-circuited with the power line (S210).

When the voltage sensor 70 is determined to be in the fault state and the sensed voltage $V_{dc\_Sensor}$ is greater than the minimum reference voltage $V_{low-lim}$ and less than the maximum reference voltage $V_{high\_lim}$, the voltage estimator 32 may determine that the voltage sensor 70 is in a rationality fault state (a fault in which the voltage sensor outputs the sensed voltage within the normal range but actually outputs the wrongly sensed voltage) (S220). When the voltage sensor 70 is in the rationality fault state, it is difficult to accurately control the motor 40 using the sensed voltage $V_{dc\_Sensor}$.

When the voltage sensor 70 is determined to be in the fault state, the voltage estimator 32 may control the motor 40 in a fail-safe mode using the estimated voltage $V_{dc\_Est}$ instead of the sensed voltage $V_{dc\_Sensor}$ (S230). In this case, motor control performance at the same level as that of the case of using the voltage sensor 70 can be maintained. In addition, for safety, if the voltage sensor 70 is determined to be in the fault state, the maximum output speed and torque of the motor 40 can be limited.

As described above, according to the exemplary embodiment of the present invention, the voltage of the input terminal of the inverter 20 can be estimated even without the voltage sensor, thereby reducing an additional cost.

When the voltage sensor 70 is provided to measure the voltage of the input terminal of the inverter 20, the voltage of the input terminal of the inverter 20 can be estimated, thereby effectively determining the fault of the voltage sensor 70. In addition, even if the voltage sensor 70 becomes defective, the motor 40 can be controlled normally, thereby removing a risk involved in the motor control using the wrongly sensed voltage.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for estimating a voltage of an input terminal of an inverter, comprising steps of:
    checking three-phase currents flowing from an inverter to a motor; and
    calculating a voltage of an input terminal of the inverter based on a plurality of design parameters, the three-phase currents, and PWM duties for determining switching operations of a plurality of switching elements of the inverter.

2. The method of claim 1, wherein
the step of calculating the voltage of the input terminal of the inverter includes calculating estimated three-phase voltages based on the plurality of design parameters and the three-phase currents, wherein
a voltage $V_{dc\_Est}$ of the input terminal of the inverter is calculated from an equation of $V_{dc\_Est} = V_{n\_Est} \times (\text{PWMduty}_n - 0.5)$,
where $V_{n\_Est}$ and PWMduty$_n$ are values corresponding to the same phase, $V_{n\_Est}$ is one of the estimated three-phase voltages, and PWMduty$_n$ is one of the PWM duties.

3. The method of claim 2, wherein
the step of calculating the estimated three-phase voltages includes steps of:
converting the three-phase currents into a D-axis current and a Q-axis current that correspond to a fixed coordinate system;
converting the D-axis current and the Q-axis current into a d-axis feedback current and a q-axis feedback current that correspond to a synchronous coordinate system;
calculating a d-axis estimated voltage and a q-axis estimated voltage based on the d-axis feedback current and the q-axis feedback current;
converting the d-axis estimated voltage and the q-axis estimated voltage into a D-axis estimated voltage and a Q-axis estimated voltage that correspond to the fixed coordinate system; and
converting the D-axis estimated voltage and the Q-axis estimated voltage into estimated three-phase voltages that correspond to a three-phase coordinate system.

4. The method of claim 3, wherein
the d-axis estimated voltage $V_{d\_Est}$ and the q-axis estimated voltage $V_{q\_Est}$ are calculated from equations of $$V_{d\_Est} = R_s I_{d\_feedback} + L_d \frac{d}{dt} I_{d\_feedback} - \omega_e L_q I_{q\_feedback}$$

$$V_{q\_Est} = R_s I_{q\_feedback} + L_q \frac{d}{dt} I_{q\_feedback} + \omega_e L_d I_{d\_feedback} + \omega_e \Psi_f,$$

where $I_{d\_feedback}$ is a d-axis feedback current, $I_{q\_feedback}$ is a q-axis feedback current, $R_s$ is a coil resistance of a motor armature, $L_d$ is a d-axis inductance, $\omega_e$ is an electrical angular velocity, $L_q$ is a q-axis inductance, and $\Psi_f$ is a magnetic flux interlinkage of the motor armature.

5. The method of claim 4, wherein
only the $\omega_e \Psi_f$ is calculated to calculate the q-axis estimated voltage when the $I_{d\_feedback}$, the $I_{q\_feedback}$, the $R_s$, the $L_d$, the $\omega_e$, and the $L_q$ are smaller than respectively set reference values.

6. The method of claim 4, wherein
the estimated three-phase voltages are calculated from a relationship map of the electrical angular velocity, the three-phase currents, and the three-phase voltage commands if the estimated three-phase voltages calculated from the equations of $$V_{d\_Est} = R_s I_{d\_feedback} + L_d \frac{d}{dt} I_{d\_feedback} - \omega_e L_q I_{q\_feedback}$$

$$V_{q\_Est} = R_s I_{q\_feedback} + L_q \frac{d}{dt} I_{q\_feedback} + \omega_e L_d I_{d\_feedback} + \omega_e \Psi_f$$

based on the d-axis estimated voltage and the q-axis estimated voltage are out of a permissible error range of the experimentally measured three-phase voltages.

7. The method of claim 2, wherein the estimated three-phase voltages $V_{a\_Est}$, $V_{b\_Est}$, and $V_{c\_Est}$ are calculated from an equation of $$\begin{bmatrix} V_{a\_Est} \\ V_{b\_Est} \\ V_{c\_Est} \end{bmatrix} = \begin{bmatrix} R_s + \frac{d}{dt}L_a & \frac{d}{dt}M_{ab} & \frac{d}{dt}M_{ca} \\ \frac{d}{dt}M_{ab} & R_s + \frac{d}{dt}L_b & \frac{d}{dt}M_{bc} \\ \frac{d}{dt}M_{ca} & \frac{d}{dt}M_{bc} & R_s + \frac{d}{dt}L_c \end{bmatrix} \begin{bmatrix} I_a \\ I_b \\ I_c \end{bmatrix} - \begin{bmatrix} \omega_e \Psi_f \sin\theta \\ \omega_e \Psi_f \sin\left(\theta - \frac{2}{3}\pi\right) \\ \omega_e \Psi_f \sin\left(\theta + \frac{2}{3}\pi\right) \end{bmatrix},$$

where $I_a$, $I_b$, and $I_c$ are three-phase currents, $R_s$ is a coil resistance of a motor armature, $L_{a,b,c}$ are magnetic inductances of respective phases, $M_{ab,bc,ca}$ are interphase mutual inductances, $\omega_e$ is an electrical angular velocity, $\Psi_f$ is a magnetic flux interlinkage of the motor armature, $\theta$ and is an angle between a d-axis and an a-phase.

8. The method of claim 7, wherein only the $$\begin{bmatrix} \omega_e \Psi_f \sin\theta \\ \omega_e \Psi_f \sin\left(\theta - \frac{2}{3}\pi\right) \\ \omega_e \Psi_f \sin\left(\theta + \frac{2}{3}\pi\right) \end{bmatrix}$$

is calculated to calculate the estimated three-phase voltages if the $I_a$, $I_b$, and $I_c$, the $R_s$, the $L_{a,b,c}$, the $M_{ab,bc,ca}$ and the $\omega_e$ are smaller than respectively set reference values.

9. The method of claim 7, wherein the estimated three-phase voltages are calculated from a relationship map of the electrical angular velocity, the three-phase currents, and the three-phase voltage commands if the estimated three-phase voltages calculated from the equation of $$\begin{bmatrix} V_{a\_Est} \\ V_{b\_Est} \\ V_{c\_Est} \end{bmatrix} = \begin{bmatrix} R_s + \frac{d}{dt}L_a & \frac{d}{dt}M_{ab} & \frac{d}{dt}M_{ca} \\ \frac{d}{dt}M_{ab} & R_s + \frac{d}{dt}L_b & \frac{d}{dt}M_{bc} \\ \frac{d}{dt}M_{ca} & \frac{d}{dt}M_{bc} & R_s + \frac{d}{dt}L_c \end{bmatrix} \begin{bmatrix} I_a \\ I_b \\ I_c \end{bmatrix} - \begin{bmatrix} \omega_e \Psi_f \sin\theta \\ \omega_e \Psi_f \sin\left(\theta - \frac{2}{3}\pi\right) \\ \omega_e \Psi_f \sin\left(\theta + \frac{2}{3}\pi\right) \end{bmatrix}$$

are out of a permissible error range of the experimentally measured three-phase voltages.

10. The method of claim 1, wherein the step of calculating the voltage of the input terminal of the inverter further includes steps of:
converting the three-phase currents into a D-axis current and a Q-axis current that correspond to a fixed coordinate system;
converting the D-axis current and the Q-axis current into a d-axis feedback current and a q-axis feedback current that correspond to a synchronous coordinate system;
calculating a d-axis estimated voltage and a q-axis estimated voltage based on the d-axis feedback current and the q-axis feedback current;
converting the PWM duties into a D-axis PWM duty and a Q-axis PWM duty that correspond to the fixed coordinate system; and
converting the D-axis PWM duty and the Q-axis PWM duty into a d-axis PWM duty and a q-axis PWM duty that correspond to the synchronous coordinate system, wherein
the voltage $V_{dc\_Est}$ of the input terminal of the inverter is calculated from an equation of $V_{dc\_Est}=V_{m\_Est}\times(\text{PWMduty}_m-0.5)$,
where $V_{m\_Est}$ and PWMduty$_m$ correspond to the same axis, $V_{m\_Est}$ is one of the d-axis estimated voltage and the q-axis estimated voltage, and PWMduty$_m$ is one of the d-axis PWM duty and the q-axis PWM duty.

11. A motor control method comprising steps of:
receiving a sensed voltage of an input terminal of an inverter from a voltage sensor;
calculating an estimated voltage of the input terminal of the inverter if the inverter applies a voltage to a motor;
comparing an absolute value between the sensed voltage and the estimated voltage with a permissible error reference;
counting an elapsed time after the absolute value exceeds the permissible error reference if the absolute value is greater than the permissible error reference; and
determining that the voltage sensor is in a fault state if the elapsed time is greater than a reference time.

12. The motor control method of claim 11, wherein the step of calculating the estimated voltage of the input terminal of the inverter is performed again if the elapsed time is less than or equal to the reference time.

13. The motor control method of claim 12, further comprising a step of:
resetting the counted elapsed time to zero if the absolute value is less than or equal to the permissible error reference.

14. The motor control method of claim 11, further comprising steps of:
comparing the sensed voltage with a minimum reference voltage and a maximum reference voltage if the voltage sensor is determined to be in the fault state;
determining that a wire of the voltage sensor is disconnected or short-circuited to a ground if the sensed voltage is less than or equal to the minimum reference voltage; and
determining that the wire of the voltage sensor is short-circuited with a power line if the sensed voltage is greater than or equal to the maximum reference voltage.

15. The motor control method of claim 14, further comprising a step of:
determining that the voltage sensor is in a rationality fault state if the voltage sensor is determined to be in the fault state and the sensed voltage is greater than the minimum reference voltage and less than the maximum reference voltage.

16. The motor control method of claim 11, further comprising a step of:
controlling the motor in a fail-safe mode using the estimated voltage instead of the sensed voltage if the voltage sensor is determined to be in the fault state.

17. The motor control method of claim 16, further comprising a step of:
limiting a maximum output speed and a maximum output torque of the motor if the voltage sensor is determined to be in the fault state.

18. The motor control method of claim 11, wherein
the step of calculating the estimated voltage of the input terminal of the inverter includes checking three-phase currents flowing from the inverter to the motor, and
the estimated voltage of the input terminal of the inverter is calculated based on a plurality of design parameters, the three-phase currents, and PWM duties for determining switching operations of a plurality of switching elements of the inverter.

19. The motor control method of claim 18, wherein
the step of calculating the estimated voltage of the input terminal of the inverter further includes calculating estimated three-phase voltages based on the plurality of design parameters and the three-phase currents, wherein
the estimated voltage $V_{dc\_Est}$ of the input terminal of the inverter is calculated from an equation of
$V_{dc\_Est} = V_{n\_Est} \times (\text{PWMduty}_n - 0.5)$,
where $V_{n\_Est}$ and PWMduty$_n$ are values corresponding to the same phase, $V_{n\_Est}$ is one of the estimated three-phase voltages, and PWMduty$_n$ is one of the PWM duties.

20. The motor control method of claim 19, wherein
the step of calculating the estimated three-phase voltages includes steps of:
converting the three-phase currents into a D-axis current and a Q-axis current that correspond to a fixed coordinate system;
converting the D-axis current and the Q-axis current into a d-axis feedback current and a q-axis feedback current that correspond to a synchronous coordinate system;
calculating a d-axis estimated voltage and a q-axis estimated voltage based on the d-axis feedback current and the q-axis feedback current;
converting the d-axis estimated voltage and the q-axis estimated voltage into a D-axis estimated voltage and a Q-axis estimated voltage that correspond to the fixed coordinate system; and
converting the D-axis estimated voltage and the Q-axis estimated voltage into estimated three-phase voltages that correspond to a three-phase coordinate system, wherein
the d-axis estimated voltage $V_{d\_Est}$ and the q-axis estimated voltage $V_{q\_Est}$ are calculated from equations of $$V_{d\_Est} = R_s I_{d\_feedback} + L_d \frac{d}{dt} I_{d\_feedback} - \omega_e L_q I_{q\_feedback}$$

$$V_{q\_Est} = R_s I_{q\_feedback} + L_q \frac{d}{dt} I_{q\_feedback} + \omega_e L_d I_{d\_feedback} + \omega_e \Psi_f,$$

where $I_{d\_feedback}$ is a d-axis feedback current, $I_{q\_feedback}$ is a q-axis feedback current, $R_s$ is a coil resistance of a motor armature, $L_d$ is a d-axis inductance, $\omega_e$ is an electrical angular velocity, $L_q$ is a q-axis inductance, and $\Psi_f$ is a magnetic flux interlinkage of the motor armature.

21. The motor control method of claim 20, wherein
only the $\omega_e \Psi_f$ is calculated to calculate the q-axis voltage command if the $I_{d\_feedback}$, the $I_{d\_feedback}$, the $R_s$, the $L_d$, the $\omega_e$, and the $L_q$ are smaller than respectively set reference values.

22. The motor control method of claim 20, wherein
the estimated three-phase voltages are calculated from a relationship map of the electrical angular velocity, the three-phase currents, and the three-phase voltage commands if the estimated three-phase voltages calculated from the equation of $$V_{d\_Est} = R_s I_{d\_feedback} + L_d \frac{d}{dt} I_{d\_feedback} - \omega_e L_q I_{q\_feedback}$$

$$V_{q\_Est} = R_s I_{q\_feedback} + L_q \frac{d}{dt} I_{q\_feedback} + \omega_e L_d I_{d\_feedback} + \omega_e \Psi_f$$

based on the d-axis estimated voltage and the q-axis estimated voltage are out of a permissible error range of the experimentally measured three-phase voltages.

23. The motor control method of claim 19, wherein
the estimated three-phase voltages $V_{a\_Est}$, $V_{b\_Est}$, and $V_{c\_Est}$ are calculated from an equation of $$\begin{bmatrix} V_{a\_Est} \\ V_{b\_Est} \\ V_{c\_Est} \end{bmatrix} = \begin{bmatrix} R_s + \frac{d}{dt}L_a & \frac{d}{dt}M_{ab} & \frac{d}{dt}M_{ca} \\ \frac{d}{dt}M_{ab} & R_s + \frac{d}{dt}L_b & \frac{d}{dt}M_{bc} \\ \frac{d}{dt}M_{ca} & \frac{d}{dt}M_{bc} & R_s + \frac{d}{dt}L_c \end{bmatrix} \begin{bmatrix} I_a \\ I_b \\ I_c \end{bmatrix} - \begin{bmatrix} \omega_e \Psi_f \sin\theta \\ \omega_e \Psi_f \sin\left(\theta - \frac{2}{3}\pi\right) \\ \omega_e \Psi_f \sin\left(\theta + \frac{2}{3}\pi\right) \end{bmatrix},$$

where $I_a$, $I_b$, and $I_c$ are three-phase currents, $R_s$ is a coil resistance of a motor armature, $L_{a,b,c}$ are magnetic inductances of respective phases, $M_{ab,bc,ca}$ are interphase mutual inductances, $\omega_e$ is an electrical angular velocity, $\Psi_f$ is a magnetic flux interlinkage of the motor armature, $\theta$ and is an angle between a d-axis and an a-phase.

24. The motor control method of claim 23, wherein
only the $$\begin{bmatrix} \omega_e \Psi_f \sin\theta \\ \omega_e \Psi_f \sin\left(\theta - \frac{2}{3}\pi\right) \\ \omega_e \Psi_f \sin\left(\theta + \frac{2}{3}\pi\right) \end{bmatrix}$$

is calculated to calculate the estimated three-phase voltage if the $I_a$, $I_b$, and $I_c$, the $R_s$, the $L_{a,b,c}$, the $M_{ab,bc,ca}$, and the $\omega_e$ are smaller than respectively set reference values.

25. The motor control method of claim 23, wherein
the estimated three-phase voltages are calculated from a relationship map of the electrical angular velocity, the three-phase currents, and the three-phase voltage commands if the estimated three-phase voltages calculated from the equation of $$\begin{bmatrix} V_{a\_Est} \\ V_{b\_Est} \\ V_{c\_Est} \end{bmatrix} = \begin{bmatrix} R_s + \frac{d}{dt}L_a & \frac{d}{dt}M_{ab} & \frac{d}{dt}M_{ca} \\ \frac{d}{dt}M_{ab} & R_s + \frac{d}{dt}L_b & \frac{d}{dt}M_{bc} \\ \frac{d}{dt}M_{ca} & \frac{d}{dt}M_{bc} & R_s + \frac{d}{dt}L_c \end{bmatrix} \begin{bmatrix} I_a \\ I_b \\ I_c \end{bmatrix} -$$

$$\begin{bmatrix} \omega_e \Psi_f \sin\theta \\ \omega_e \Psi_f \sin\left(\theta - \frac{2}{3}\pi\right) \\ \omega_e \Psi_f \sin\left(\theta + \frac{2}{3}\pi\right) \end{bmatrix}$$

are out of a permissible error range of the experimentally measured three-phase voltages.

26. The motor control method of claim 18, wherein the step of calculating the estimated voltage of the input terminal of the inverter includes steps of:

converting the three-phase currents into a D-axis current and a Q-axis current that correspond to a fixed coordinate system;

converting the D-axis current and the Q-axis current into a d-axis feedback current and a q-axis feedback current that correspond to a synchronous coordinate system;

calculating a d-axis estimated voltage and a q-axis estimated voltage based on the d-axis feedback current and the q-axis feedback current;

converting the PWM duties into a D-axis PWM duty and a Q-axis PWM duty that correspond to the fixed coordinate system; and converting the D-axis PWM duty and the Q-axis PWM duty into a d-axis PWM duty and a q-axis PWM duty that correspond to the synchronous coordinate system, wherein the estimated voltage $V_{dc\_Est}$ of the input terminal of the inverter is calculated from the equation of $V_{dc\_Est} = V_{m\_Est} \times (PWMduty_m - 0.5)$, where $V_{m\_Est}$ and $PWMduty_m$ are values that correspond to the same axis, $V_{m\_Est}$ is one of the d-axis estimated voltage and the q-axis estimated voltage, and $PWMduty_m$ is one of the d-axis PWM duty and the q-axis PWM duty.

27. A non-transitory computer-readable recording medium comprising computer executable instructions of which cause a motor controller to perform the method according to claim 1.

* * * * *